(12) United States Patent
Watatsu et al.

(10) Patent No.: US 7,713,478 B2
(45) Date of Patent: May 11, 2010

(54) EQUIPMENT AND METHOD FOR MEASURING SILICON CONCENTRATION IN PHOSPHORIC ACID SOLUTION

(75) Inventors: Haruru Watatsu, Okayama (JP); Nobuhiko Izuta, Okayama (JP); Hideo Yata, Nakano-ku (JP)

(73) Assignee: Apprecia Technology Inc., Tokyo (JP)

( * ) Notice: Subject to any disclaimer, the term of this patent is extended or adjusted under 35 U.S.C. 154(b) by 634 days.

(21) Appl. No.: 11/434,872

(22) Filed: May 17, 2006

(65) Prior Publication Data

US 2006/0263251 A1    Nov. 23, 2006

(30) Foreign Application Priority Data

May 17, 2005    (JP)    ............... 2005-144075

(51) Int. Cl.
  *G01N 15/06*    (2006.01)
  *C25F 3/00*    (2006.01)
(52) U.S. Cl. ........................ 422/68.1; 216/99
(58) Field of Classification Search ................ 422/68.1; 216/99
See application file for complete search history.

(56) References Cited

U.S. PATENT DOCUMENTS

| | | | |
|---|---|---|---|
| 4,828,660 A * | 5/1989 | Clark et al. ................. | 205/471 |
| 4,980,017 A | 12/1990 | Kaji et al. | |
| 5,336,356 A * | 8/1994 | Ban et al. ............... | 156/345.26 |
| 5,470,421 A | 11/1995 | Nakada et al. | |
| 6,001,215 A * | 12/1999 | Ban ....................... | 156/345.15 |

FOREIGN PATENT DOCUMENTS

| | | | |
|---|---|---|---|
| EP | 1069598 A1 * | 1/2001 | |
| JP | 11-293479 | 10/1999 | |
| JP | 2002-299313 | 10/2002 | |

* cited by examiner

*Primary Examiner*—Jill Warden
*Assistant Examiner*—Dean Kwak
(74) *Attorney, Agent, or Firm*—Chapman and Cutler LLP

(57) ABSTRACT

Disclosed is equipment for measuring a silicon concentration in a phosphoric acid solution under use as an etching solution during operation of a semiconductor substrate processing system. The equipment is provided with at least a reaction tank and a concentration-measuring tank. The reaction tank includes a reaction unit for adding hydrofluoric acid to a predetermined constant amount of the phosphoric acid solution drawn out of the semiconductor substrate processing system to form a silicon fluoride compound and then causing the silicon fluoride compound to evaporate. The concentration-measuring tank comprises a hydrolysis unit for bubbling the silicon fluoride compound, which has evaporated from the reaction tank, through deionized water to hydrolyze the silicon fluoride compound and a measurement unit for determining a change rate of silicon concentration in the deionized water subsequent to the bubbling. Also disclosed is a method for measuring a silicon concentration in a phosphoric acid solution under recirculation and use as an etching solution in a semiconductor substrate processing system in operation.

9 Claims, 4 Drawing Sheets

EQUIPMENT AND METHOD FOR MEASURING SILICON CONCENTRATION IN PHOSPHORIC ACID SOLUTION

FIELD OF THE INVENTION

This invention relates to equipment and a method for measuring a silicon concentration in a phosphoric acid solution under recirculation and use as an etching solution during operation of a semiconductor substrate processing system (hereinafter called "etching system"). These equipment and method are useful especially for such a process as subjecting a silicon compound film, which is formed on a semiconductor silicon substrate, to etching with a phosphoric acid solution in which silicon has been dissolved beforehand.

BACKGROUND ART

Upon removing a silicon compound film from a semiconductor silicon substrate in an etching system, the silicon compound film is generally subjected to etching with a phosphoric acid solution of high temperature and high concentration. The etching solution (phosphoric acid solution) employed in the above-described etching has been recirculated and used many times. After each etching, the silicon component remains as a nonvolatile silicon compound in the phosphoric acid solution, and under this condition, the next etching is conducted. The concentration of silicon contained as the silicon compound in the phosphoric acid solution, therefore, varies in every etching. As a result of such variations in the concentration of silicon in the etching solution, changes take place in the etch characteristics of silicon compound films to be etched as will be described below.

Firstly, an increase in the concentration of silicon in a phosphoric acid solution leads to a reduction in the etch rate of a silicon compound film. With a view to inhibiting such a reduction in etch rate, it has been proposed to have a solute (silicon component) in a phosphoric acid solution, which is under use for etching, collectively precipitated so that the life of the phosphoric acid solution can be prolonged (for example, JP-A-2002-299313 and JP-A-11-293479).

According to an investigation by the present inventors, the above-described reduction in etch rate has been found to substantially differ in percent reduction depending on the silicon compound of the silicon compound film to be etched. Comparing a silicon nitride film with a silicon oxide film, for example, there is a difference as will be described below. When the concentration of silicon in a phosphoric acid solution increases from 0 ppm to 50 ppm under given etching conditions, the etch rate of the silicon oxide film is reduced significantly by 75 to 85% as opposed to the percent reduction of the etch rate of the silicon nitride film which is as little as 10 to 20% or so. It is, therefore, very important for uniform etching to accurately grasp the concentration of silicon in a phosphoric acid solution, which is under use as an etching solution in an etching system, and to control the concentration of silicon.

A control method, which has conventionally been applied to a phosphoric acid solution under use in an etching system in operation, is to periodically replace the recirculated and used phosphoric acid solution lot by lot. Namely, the phosphoric acid solution is periodically replaced to prevent the concentration of silicon in the phosphoric acid solution, which is to be used for etching, from exceeding a tolerance. However, the solution life which is relied upon in the above control method has been derived from a rule of thumb, so that control in real sense, specifically the control of silicon concentration in a phosphoric acid solution under use for etching is not performed.

The above-described etching process is conducted with a phosphoric acid solution which does not contain much silicon. In contrast to this etching process, there is also an etching process in which with a view to making an improvement in the etch selectivity in the etching of a multilayer film, a wafer with a silicon compound film formed thereon is used to deliberately dissolve silicon in an etching solution and etching is then conducted in the phosphoric acid solution with silicon included therein beforehand. Similar to the above-described control method, the control of the life of the etching solution also relies upon a rule of thumb in this etching process. In this etching process, the concentration at which silicon is dissolved in the phosphoric acid solution beforehand is achieved by dissolving, in the above-described manner, silicon in the phosphoric acid solution under conditions derived from experiences. In other words, this etching process is not performed either while controlling whether or not a desired amount of silicon is actually dissolved in the phosphoric acid solution under use.

If the concentration of silicon is successively measured in a phosphoric acid solution under recirculation and use in an etching step of a silicon compound film with the phosphoric acid solution, control of the silicon concentration in a phosphoric acid solution, in real sense, becomes feasible. Further, the control of the concentration of silicon actually contained in the phosphoric acid solution under use as an etching solution directly leads to the control of etch rate and etch selectively as described above.

Under the current circumstances, however, the control of the life of a phosphoric acid solution (the control of the concentration of silicon in a phosphoric acid solution) is solely performed under a rule of thumb as descried above. This is attributed to the existence of no known method or equipment for the measurement of the concentration of silicon contained in a phosphoric acid solution under recirculation and use, which can be used online for (in other words, can be used for automated control of) an etching system that subjects a silicon compound film, which is formed on a semiconductor silicon substrate, to etching with the phosphoric acid solution at high temperature. A description will hereinafter be made about the current circumstances.

Methods, which are commonly employed upon performing an analysis of the concentration of silicon in a phosphoric acid solution, include ICP-AES (Inductively Coupled Plasma Atomic Emission Spectroscopy) based on JIS-K0116 and spectral analysis methods such as an atomic absorption analysis based on JIS-K0121. The use of these analytical methods permits precise analyses at very high accuracy.

Adoption of such a method, however, requires an emitter for making an analysis target emit light, a spectrometer for dispersing the light, a detector for detecting the thus-dispersed light, and the like, and therefore, requires a complex and large etching system. Moreover, the phosphoric acid solution under use as an etching solution in the etching system, said phosphoric acid solution being a measurement target, is high in concentration and also high in temperature. For the application of such an analytical method as described above, it is necessary to conduct pretreatment of a measurement sample before the measurement such as cooling it down to around room temperature and subsequently diluting the same. It is, therefore, very difficult to incorporate such analysis equipment in an etching system and to perform measurement continuously (with time). Moreover, such analysis equipment is costly not only in its own price but also in its maintenance. There is, accordingly, a problem in this respect too.

SUMMARY OF THE INVENTION

An object of the present invention is to provide a measuring equipment and measuring method, which can be effectively used in an etching system that makes use of a phosphoric acid solution as an etching solution and which can continuously (with time), easily and economically measure the concentration of silicon in the phosphoric acid solution under recirculation and use at high temperature and high concentration in general etching without needing any pretreatment. Another object of the present invention is to contribute to the stable and efficient fabrication of semiconductor substrates of excellent performance by permitting the control of the concentration of silicon in a phosphoric acid solution, which is under use in an etching system, in such a state as always allowing to conduct good etching.

In one aspect of the present invention, there is thus provided equipment for measuring a silicon concentration in a phosphoric acid solution under use as an etching solution during operation of a semiconductor substrate processing system, said equipment being provided with at least a reaction tank and a concentration-measuring tank, wherein:

the reaction tank comprises a reaction unit for adding hydrofluoric acid to a predetermined constant amount of the phosphoric acid solution drawn out of the semiconductor substrate processing system to form a silicon fluoride compound and then causing the silicon fluoride compound to evaporate; and the concentration-measuring tank comprises a hydrolysis unit for bubbling the silicon fluoride compound, which has evaporated from the reaction tank, through deionized water to hydrolyze the silicon fluoride compound and a measurement unit for measuring a change rate of silicon concentration in the deionized water subsequent to the bubbling.

In another aspect of the present invention, there is also provided a method for measuring a silicon concentration in a phosphoric acid solution under recirculation and use as an etching solution in a semiconductor substrate processing system in operation, which comprising the following steps:

drawing a predetermined constant amount of the phosphoric acid solution out of the semiconductor substrate processing system, adding hydrofluoric acid to the predetermined constant amount of the phosphoric acid solution to form a silicon fluoride compound through a reaction therebetween, and then causing the silicon fluoride compound to evaporate from the predetermined constant amount of the phosphoric acid solution; and bubbling the silicon fluoride compound, which has evaporated, through deionized water to hydrolyze the silicon fluoride compound, and then determining a change rate of silicon concentration in the deionized water.

According to the present invention, it is possible to continuously (with time) and economically measure, in a manner far simpler than the conventional measuring methods of the concentration of silicon in a phosphoric acid solution, the concentration of silicon in a phosphoric acid solution under recirculation and use at high temperature and high concentration during operation of an etching system without needing any pretreatment. According to the present invention, it is also possible, in a simple manner, to make improvements in process performance upon conducting etching of silicon compound films with a phosphoric acid solution of high temperature and to efficiently use the phosphoric acid solution as an etching solution. This leads to a reduction in the amount of phosphoric acid to be discarded as a waste liquid. In this respect too, economical and good etching is feasible, thereby making it possible to achieve high-efficiency etching.

DETAILED DESCRIPTION OF PREFERRED EMBODIMENTS

Figure 1:
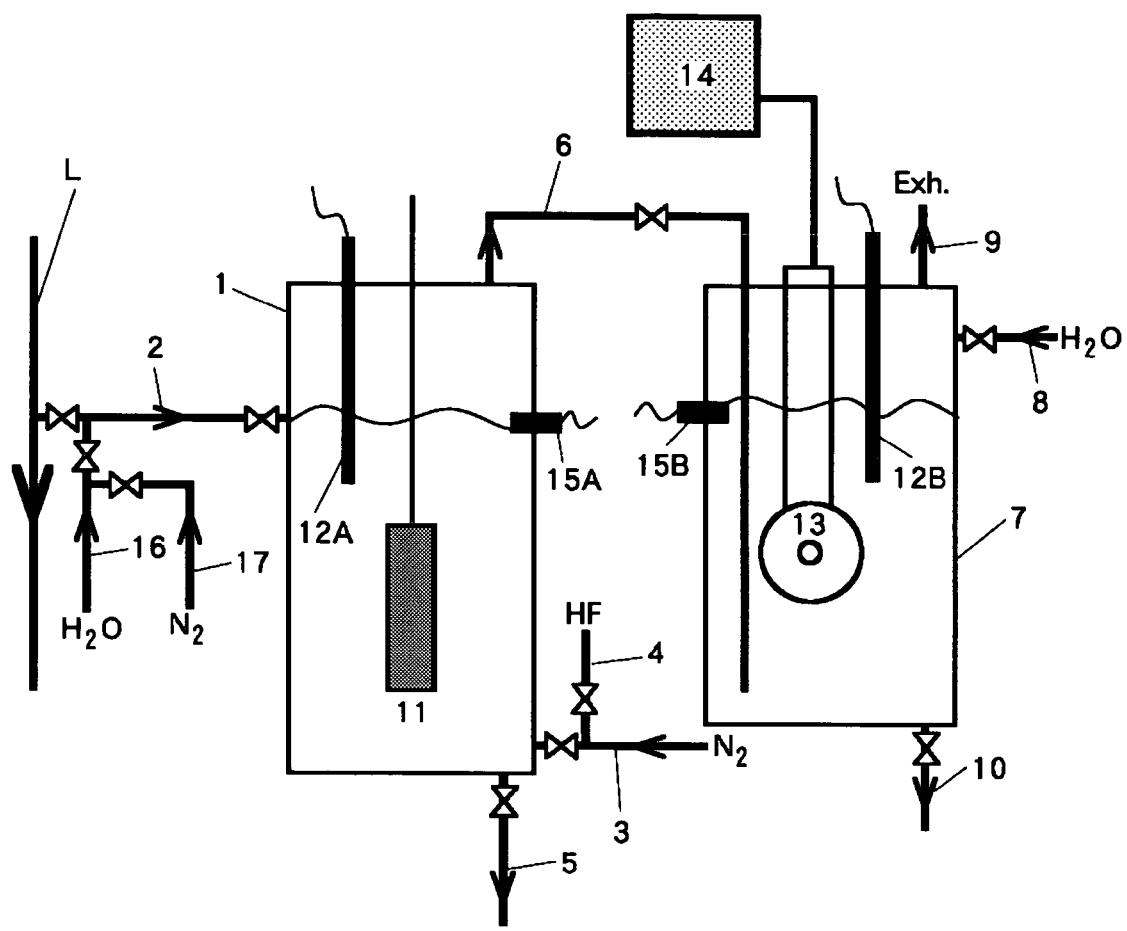
FIG. 1 is a construction diagram schematically showing one example of measuring equipment to which the present invention has been applied.

The present invention will hereinafter be described in detail based on preferred embodiments. The measurement principle of the method of the present invention for the measurement of a silicon concentration in a phosphoric acid solution will be outlined hereinafter. From a semiconductor substrate processing system in which a phosphoric acid solution is used as an etching solution, a predetermined constant amount of said phosphoric acid solution is drawn firstly. Hydrofluoric acid is added to the predetermined constant amount of the phosphoric acid solution to form a silicon fluoride compound through a reaction therebetween. The silicon fluoride compound is next caused to evaporate, and the silicon fluoride compound so evaporated is caused to bubble through deionized water to hydrolyze the silicon fluoride compound. After the bubbling, a change rate of silicon concentration in the deionized water is finally determined to control the silicon concentration in the phosphoric acid solution under use as the etching solution. As an inexpensive device useful for the determination of a change rate of silicon concentration in deionized water, there is an electric conductivity meter, an ultrasonic concentration meter, an ion meter or the like. According to an investigation by the present inventors, however, the use of an electric conductivity meter can bring about particularly preferred results. Therefore, a description will hereinafter be made of a case in which an electric conductivity meter is used, although the present invention shall not be limited to the use of such an electric conductivity meter.

The measuring equipment according to the present invention, which can realize the above-described measurement principle, can simply and economically measure the concentration of silicon in a phosphoric acid solution which is being recirculated and used as an etching solution during operation of an etching system. The measuring equipment according to the present invention basically comprises a reaction tank, a concentration-measuring tank, and a line system arranged around these tanks. A portion of the phosphoric acid solution under recirculation and use in the etching system in operation is drawn out of etching system, and is fed to the reaction tank.

The phosphoric acid solution which has been fed to the reaction tank is then caused to react with hydrofluoric acid in the reaction tank. As a result, a silicon fluoride compound is formed from the silicon component in the phosphoric acid solution in the reaction tank.

In the measuring equipment according to the present invention, the silicon fluoride compound which has been formed through the reaction is then caused to evaporate, and together with gas fed from the reaction tank, is introduced into the concentration-measuring tank arranged adjacent to the reaction tank. In the concentration-measuring tank, the gas which has been fed from the reaction tank and contains the evaporated silicon fluoride compound is caused to bubble through deionized water, so that the silicon fluoride compound is hydrolyzed. After the bubble of the gas fed from the reaction tank, a change rate of silicon concentration in deionized water in the concentration-measuring tank is then determined. No particular limitation is imposed on the time for which the gas is bubbled through the deionized water as described above, because the time varies depending upon the amount of the phosphoric acid solution to be drawn, in other words, to be sampled, the method employed for the measurement of the change rate of the silicon concentration, etc. The bubbling time can, therefore, be determined as needed depending upon the sampling conditions, reaction conditions, and so on. For example, when determining a change rate of silicon concentration with an electric conductivity meter by setting at 300 to 500 mL the amount of a phosphoric acid solution to be sampled, a time of from 3 to 10 minutes or so is sufficient as the time for which gas is bubbled through deionized water. By the series of these operations, it is possible to determine the silicon concentration in the phosphoric acid solution under recirculation and use during operation of the etching system.

About a procedure to be performed for the analysis of the silicon concentration in a phosphoric acid solution by the measuring equipment of the above-described construction according to the present invention, a more detailed description will be made step by step. Firstly, from a recirculation line of a phosphoric acid solution in an etching system, a predetermined amount of the phosphoric acid solution is drawn and fed to the reaction tank, and hydrofluoric acid is added to the phosphoric acid solution to react them with each other. In the present invention, it is preferred to add hydrofluoric acid while controlling the phosphoric acid solution within a temperature range of from 70 to 180° C. In conventional etching, a phosphoric acid solution of about 85% concentration is recirculated and used at a temperature of from 150 to 160° C. A phosphoric acid solution to be fed to the reaction tank from such a recirculation line for the phosphoric acid solution is lowered in temperature in the course of its feeding. According to an investigation by the present inventors, it is most preferred to raise the temperature of the phosphoric acid solution to 130° C. or so by a heating means arranged in the reaction tank. According to a further investigation, however, the silicon concentration in the phosphoric acid solution can be measured insofar as the phosphoric acid solution fed from the etching system to the reaction tank has a temperature of 70° C. or higher. In this case, it becomes no longer necessary to arrange a heating means in the reaction tank so that the measuring equipment can be simplified. However, the accuracy of measurement tends to decrease as the temperature of the phosphoric acid solution drops. It is, accordingly, preferred to add hydrofluoric acid while controlling the phosphoric acid solution within a temperature range of 70° C. and higher.

When hydrofluoric acid is added to the phosphoric acid solution in the reaction tank as described above, the silicon compound in the phosphoric acid solution reacts with phosphoric acid so that the silicon compound in the phosphoric acid solution is converted into silicon tetrafluoride gas. In the present invention, using inert gas such as nitrogen gas as a carrier, for example, the silicon tetrafluoride gas is caused to evaporate from the phosphoric acid solution and is then fed to the concentration-measuring tank. These gases are caused to bubble through deionized water in the concentration-measuring tank, so that the silicon tetrafluoride in the gases is hydrolyzed into hexafluorosilicic acid. It is preferred to maintain the constant temperature of the phosphoric acid solution in the reaction tank during the operation that silicon tetrafluoride gas is fed from the phosphoric acid solution to the deionized water and is caused to bubble through the deionized water. The phosphoric acid solution may preferably be maintained at a constant temperature by the heating means arranged in the reaction tank. When the reaction tank is not provided with such a heating means, the temperature of the measurement environment may preferably be maintained to control the constant temperature descending rate of the phosphoric acid solution constant. In the present invention, the electric conductivity of a hexafluorosilicic solution obtained as described above (the deionized water subsequent to the bubbling) is finally measured using an electric conductivity meter. As a result, it becomes possible to indirectly determine the concentration of silicon contained in the phosphoric acid solution under recirculation and use in the etching system.

The above-described series of operations can be automatically performed. It is, therefore, possible to continuously monitor and control the concentration of silicon contained in a phosphoric acid solution under use in an etching system in operation, provided that it is designed to permit sampling of the phosphoric acid solution at predetermined constant intervals from a recirculation line for the phosphoric acid solution in the etching system and the measuring equipment according to the present invention is incorporated in the etching system.

The electric conductivity of a liquid also varies depending upon the temperature, but this variation can be corrected by a simple calculation formula. In the measurement of the electric conductivity in the concentration-measuring tank, any variation in the electric conductivity due to a temperature change in the concentration-measuring tank can, therefore, be compensated for.

In the gaseous substances transferred from the reaction tank to the concentration-measuring tank by means of the inert gas as a carrier, not only the above-described silicon tetrafluoride but also water and hydrogen fluoride are also contained. In the present invention, however, their effects can be ignored as will be described below. Firstly, water is a substance which has no electric conductivity. In addition, the amount of water transferred into the concentration-measuring tank is very little compared with the amount of deionized water fed in the concentration-measuring tank. Water can be ignored accordingly. Hydrofluoric acid, on the other hand, has electric conductivity, but its electric conductivity is low compared with that of hexafluorosilicic acid which is a dibasic acid. Moreover, according to an investigation by the present inventors, the amount of each substance to be transferred into the concentration-measuring tank varies depending upon the amount of silicon tetrafluoride formed in the reaction tank, when the amount of hydrofluoric acid to be added to the phosphoric acid solution in the reaction tank is set constant and the reaction conditions such as temperature are also set constant. This means that under constant reaction conditions, the concentration of hexafluorosilicic acid, specifically the concentration of silicon in the phosphoric acid solution controls the electric conductivity of the deionized water in the concentration-measuring tank and the effect of hydrogen fluoride can be ignored.

With reference to FIG. 1, a description will hereinafter be made of one example of measuring equipment according to the present invention which makes it possible to practice the method of the present invention. The measuring equipment according to the present invention is provided, as its principal elements, with a reaction tank 1 and a concentration-measuring tank 7. These reaction tank 1 and concentration-measuring tank 7 are each of such a construction that can maintain the tank in a sealed state during measurement operation by the measuring equipment according to the present invention. The reaction tank 1 can be of any construction, insofar as it comprises a reaction unit for being fed with a predetermined constant amount of a phosphoric acid solution drawn out from the phosphoric acid solution, which is being recirculated and used as an etching solution in an etching system in operation, and then causing the silicon component, which is contained in the phosphoric acid solution, to evaporate as a silicon fluoride compound. The concentration-measuring tank 7, on the other hand, can be of any construction, insofar as it comprises a hydrolysis unit for being introduced with gas, which includes the silicon fluoride compound evaporated in the reaction tank 1, and then causing the gas to bubble through deionized water to hydrolyze the silicon fluoride compound, and a measurement unit for determining a change rate of silicon concentration in the deionized water. A description will hereinafter be made about these units.

The phosphoric acid solution which is being used as an etching solution during operation of the etching system is recirculated and used through a phosphoric acid solution recirculation line L in the etching system. In the equipment illustrated by way of example in FIG. 1, there is arranged a feed line 2 via which the phosphoric acid solution recirculation line L in the etching system is connected to the reaction tank 1. A portion of the phosphoric acid solution is drawn out of the recirculation line L, and this predetermined constant amount of the phosphoric acid solution is fed to the reaction tank 1.

The reaction tank 1 is also provided with a feed line 4 for a hydrofluoric acid solution. This feed line 4 has such a construction that in a state connected to an inert gas feed line 3 for feeding inert gas to the reaction tank 1, the hydrofluoric acid solution can be added to the phosphoric acid solution in the reaction tank 1. The illustrated reaction tank 1 is also provided with a liquid level sensor 15A for enabling to feed a predetermined constant amount of liquid into the reaction tank 1, a heater 11 for heating the thus-fed phosphoric acid solution as needed, and a liquid-temperature-measuring thermocouple 12A for measuring the temperature of the liquid in the reaction tank 1.

The concentration-measuring unit 7, on the other hand, is required to have the hydrolysis unit and the measurement unit as described above. Between the reaction tank 1 and the concentration-measuring tank 7, a gas feed line 6 is, therefore, arranged to feed gas, which contains the silicon fluoride compound, from the reaction tank 1 into the concentration-measuring tank 7 as illustrated in FIG. 1. Also connected to the concentration-measuring tank 7 are a deionized water feed line 8, an exhaust line 9, and a waste liquid line 10. In the concentration-measuring tank 7, there are arranged a liquid level sensor 15B for enabling to feed a predetermined constant amount of deionized water into the concentration-measuring tank 7, a liquid-temperature-measuring thermocouple 12B for measuring the temperature of the deionized water in the concentration-measuring tank 7, and an electric conductivity sensor 13 for the deionized water in the concentration-measuring tank 7. As depicted in FIG. 1, this electric conductivity sensor 13 connected to an electric conductivity monitor 14.

Designated at numeral 16 in FIG. 1 is a deionized water feed line for washing with water the feed line 2 for the phosphoric acid solution, the reaction tank 1, and the gas feed line 6. Numeral 17, on the other hand, indicates an inert gas feed line for performing purging after the water washing.

Illustrative operation of the measuring equipment of the construction as described above will next be outlined. It, however, is to be noted that the following description is merely illustrative and the present invention shall not be limited to the illustrative operation. Firstly, a portion (350-mL) of an 85% phosphoric acid solution which is being recirculated and used at a temperature of from 150 to 160° C. is fed from the etching system in operation to the reaction tank 1 via the feed line 2. Concurrently with this, deionized water (400 mL) is fed to the concentration-measuring tank 7 via the deionized water feed line 8. It is to be noted that the amounts of these liquids to be fed into the reaction tank 1 and concentration-measuring tank 7 can be controlled by the liquid level sensors 15A and 15B, respectively.

As the temperature of the phosphoric acid solution fed into the reaction tank 1 has dropped to 110 to 130° C. by a heat loss occurred during the above-described feeding operation, the phosphoric acid solution is heated by the heater 11 while measuring the liquid temperature in the reaction tank 1 by the liquid-temperature-measuring thermocouple 12A. When the temperature of the phosphoric acid solution in the reaction tank 1 has arisen to 130° C., a 50% hydrofluoric acid solution (2 mL) is added to the phosphoric acid solution via the hydrofluoric acid solution feed line 4 while feeding nitrogen gas as a carrier via the inert gas feed line 3. The phosphoric acid solution is then bubbled for 5 minutes with the nitrogen gas (5 L/min) via the inert gas feed line 3. By heating with the heater 11, the temperature of the phosphoric acid solution is also maintained at 130° C. during the bubbling with nitrogen gas.

Almost concurrently with the above-described initiation of the addition of the hydrofluoric acid solution and the feeding of the nitrogen gas, a transfer of gas with the silicon fluoride compound gas as a reaction product is initiated from the reaction tank 1 to the concentration-measuring tank 7 via the gas feed line 6. When the thus-transferred gas is caused to bubble through the deionized water in the concentration-measuring tank 7, the gaseous silicon fluoride compound contained in the gas is hydrolyzed and is absorbed as silicic acid in the deionized water. In the present invention, it is preferred to design such that during the feeding of the gaseous silicon fluoride compound into the concentration-measuring tank 7 via the gas feed line 6, the temperature and electric conductivity of the solution (deionized water) in the concentration-measuring tank 7 are monitored by the liquid-temperature-measuring thermocouple 12B and the electric conductivity monitor 14 connected to the electric conductivity sensor 13.

Reactions which are considered to take place in the reaction tank 1 or the concentration-measuring tank 7 are shown below. It is, however, to be noted that the chemical formulas shown below are strictly based on presumptions and shall by no means restrict the present invention. As a variety of silicon compounds exist in the phosphoric acid solution, they will be collectively referred to as "X—Si" in the following chemical formulas.

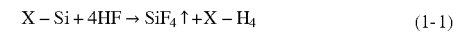
$$X-Si + 4HF \rightarrow SiF_4\uparrow + X-H_4 \quad (1\text{-}1)$$

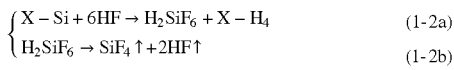
$$\begin{cases} X-Si + 6HF \rightarrow H_2SiF_6 + X-H_4 & (1\text{-}2a) \\ H_2SiF_6 \rightarrow SiF_4\uparrow + 2HF\uparrow & (1\text{-}2b) \end{cases}$$

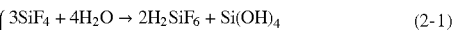
$$\begin{cases} 3SiF_4 + 4H_2O \rightarrow 2H_2SiF_6 + Si(OH)_4 & (2\text{-}1) \\ Si(OH)_4 + 6HF \rightarrow H_2SiF_6 + 4H_2O & (2\text{-}2) \end{cases}$$

The chemical formulas (1-1) and (1-2a) represent reactions between the silicon compound in the phosphoric acid solution and hydrofluoric acid. The silicon compound in the phosphoric acid solution reacts with the added hydrofluoric acid to form silicon tetrafluoride gas. It is the chemical formula (1-1) that represents this reaction. At the same time, hexafluorosilicic acid is also formed. It is the chemical formula (1-2a) that represents this reaction. The hexafluorosilicic acid formed in the above reaction is then decomposed into gaseous silicon tetrafluoride gas and hydrofluoric acid gas, because the phosphoric acid in which the hexafluorosilicic acid is dissolved has a high temperature. It is the chemical formula (1-2b) that represents this decomposition. Using the inert gas as a carrier, the silicon tetrafluoride gas formed in the reaction tank 1 is transferred into the concentration-measuring tank 7 with deionized water placed therein, and as shown by the chemical formula (2-1), is hydrolyzed into hexafluorosilicic acid and orthosilicic acid. As indicated by the chemical formula (2-2), the orthosilicic acid formed in this stage is converted into hexafluorosilicic acid by the hydrogen fluoride transferred together with the silicon tetrafluoride from the reaction tank 1. As mentioned above, the concentration of silicon contained in the phosphoric acid solution is indirectly determined in the present invention by measuring the electric conductivity of the solution in which the hexafluorosilicic acid is contained.

The present invention will next be described in further detail based on examples. It is, however, to be noted that the examples are merely illustrative and the present invention shall by no means be limited by the following examples.

Example 1

Using experimental equipment of the construction shown in FIG. 1, four standard samples of a 85% silicic acid solution, the silicon concentrations of which were known to be 0, 23, 46 and 69 ppm, respectively, were measured for electric conductivity. The thus-obtained electric conductivities had temperature-compensated values.

Portions (350 mL) of the phosphoric acid solution samples of the above-described concentrations were each separately fed to the reaction tank 1 and then heated by the heater 11 to raise its temperature to 130° C. In a similar manner as described above, a 50% hydrofluoric acid solution (2 mL) was then added to the phosphoric acid solution in the reaction tank 1 via the line 3 shown in FIG. 1 while using nitrogen gas as a carrier. Subsequently, nitrogen gas (5 mL/min) was fed via the inert gas feed line 3 to conduct bubbling for 5 minutes, so that gas is transferred from the reaction tank 1 into deionized water (400 mL) in the concentration-measuring tank 7 via the gas feed line 6. After the bubbling had been conducted for 5 minutes since the addition of the hydrofluoric acid solution to the phosphoric acid solution, the electric conductivity of the deionized water in the concentration-measuring tank 7 was measured by an electric conductivity sensor ("875EC-JIF", trade name; manufactured by The Foxboro Company). During the above-described operations, heating was effected with the heater 11 to maintain at 130° C. the temperature of the phosphoric acid solution in the reaction tank 1. In Table 1, the known silicon concentrations [ppm] of the individual phosphoric acid solution samples and the electric conductivity values of the bubbled deionized waters (solutions) in the concentration-measuring tank 7 are shown, respectively.

TABLE 1

| Si concentration in the solution placed in the reaction tank, $C_1$ [ppm] | Electric conductivity of the solution in the concentration-measuring tank, G [mS/cm] |
|---|---|
| 0 | 1 |
| 23 | 1.42 |
| 46 | 1.724 |
| 69 | 2.128 |

Figure 2:
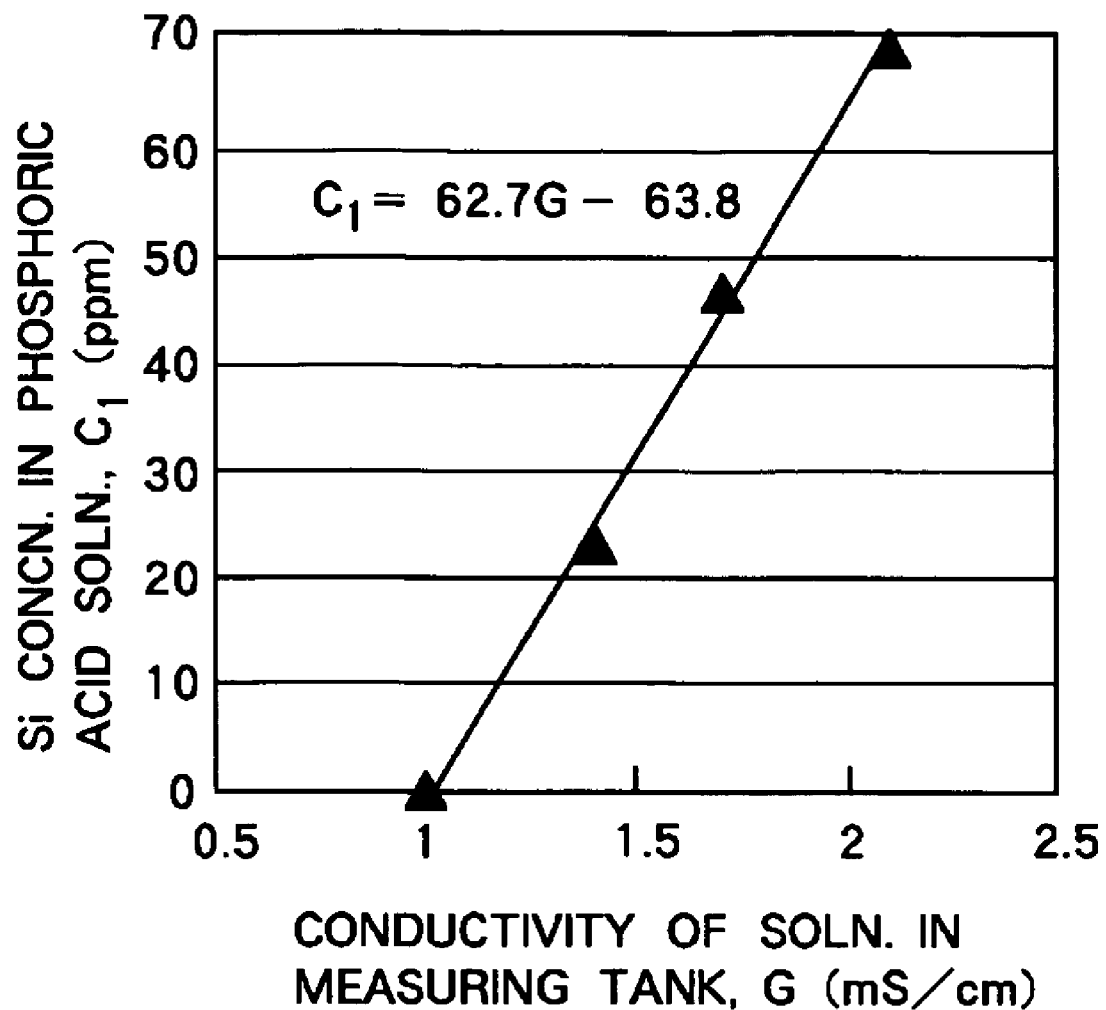
FIG. 2 is a diagrammatic representation of a relationship between the silicon concentration $C_1$ in a phosphoric acid solution fed to a reaction tank and the electric conductivity G of a solution in a concentration-measuring tank after bubbling of gas for a predetermined constant time.

FIG. 2 diagrammatically shows a relationship between the thus-obtained electric conductivity values G and the silicon concentrations $C_1$ in the corresponding phosphoric acid solutions. From these results, it has been confirmed that at least within the range of the silicon concentrations in the phosphoric acid solutions used in the above-described test, the electric conductivity G tends to increase with the silicon concentration $C_1$ in the phosphoric acid solution, and moreover, their relationship can be expressed by a linear function formula.

As to whether or not the relationship between the silicon concentrations $C_1$ in the phosphoric acid solutions used in the above-described test and the electric conductivity values G of the solutions in the concentration-measuring tank 7 is inevitable for the differences in silicon concentration among the individual phosphoric acid solutions used as standard samples, a verification was also performed by the below-described method. With respect to each solution in the concentration-measuring tank 7 upon elapsed time of 5 minutes after the addition of the corresponding hydrofluoric acid solution in the above-described test, its silicon concentration was analyzed by ICP-AES (Inductively Coupled Plasma Atomic Emission Spectroscopy). The results are shown in Table 2, in which the electric conductivity values G of the individual solutions in the concentration-measuring tank 7 are also shown.

TABLE 2

| Si concentration in the phosphoric acid solution, $C_1$ [ppm] | Si concentration of the solution in the concentration-measuring tank, $C_2$ [ppm] | Electric conductivity of the solution in the concentration-measuring tank, G [mS/cm] |
|---|---|---|
| 0 | 0 | 1.00 |
| 23 | 25 | 1.42 |
| 46 | 43 | 1.724 |
| 69 | 73 | 2.128 |

Figure 3:
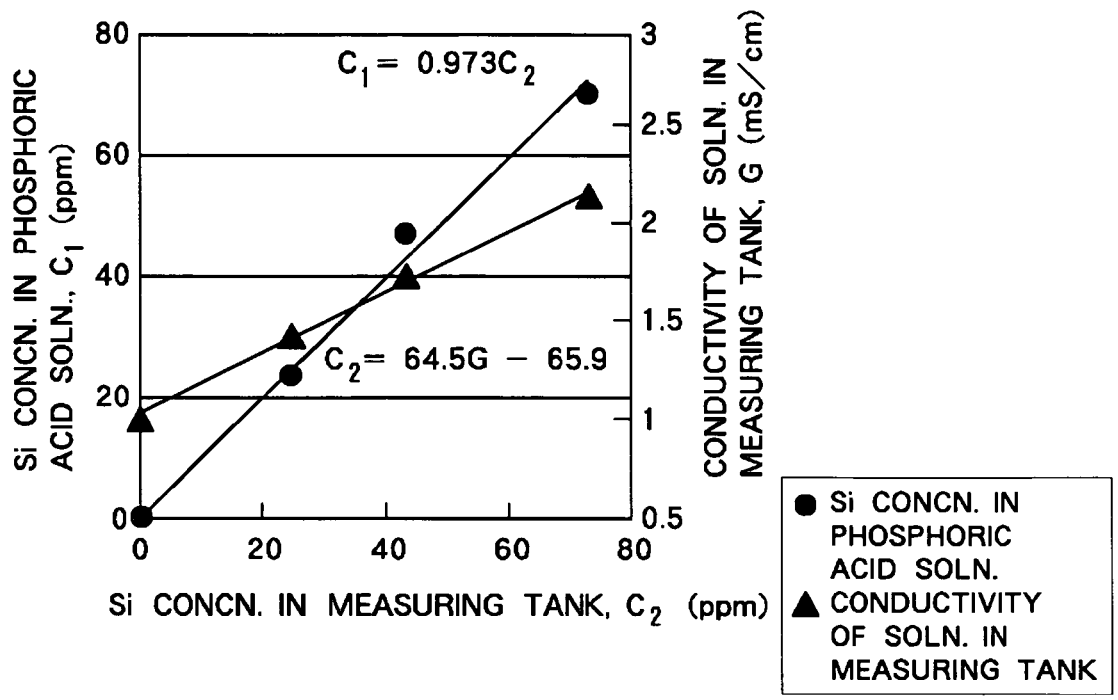
FIG. 3 is a diagrammatic representation of a relationship between the silicon concentration $C_2$ in a solution in the concentration-measuring tank and the electric conductivity G of the solution in the concentration-measuring tank.

FIG. 3 diagrammatically shows a relationship between the known silicon concentrations $C_1$ in the respective standard samples used in the test and the silicon concentrations $C_2$ in the corresponding solutions in the concentration-measuring tank 7 as determined by ICP-AES measurement after the bubbling of the gas, which had been transferred from the reaction tank 1, for 5 minutes through the corresponding deionized waters. FIG. 3 also diagrammatically shows a relationship between the silicon concentrations $C_2$ and the electric conductivity values G of the corresponding solutions in the concentration-measuring tank 7 as determined above after the bubbling of the gas, which had been transferred from the reaction tank 1, for 5 minutes through the corresponding deionized waters.

From these results, it has been confirmed that the relationship between the silicon concentrations $C_1$ in the respective phosphoric acid solutions at the time of their feeding into the reaction tank 1 or the silicon concentrations $C_2$ of the respective solutions in the concentration-measuring tank 7 as determined upon elapsed time of a predetermined constant time (5 minutes) after the addition of hydrofluoric acid into the corresponding phosphoric acid solutions in the reaction tank 1 can be expressed by a linear function formula. It has also been confirmed that the silicon concentrations $C_2$ in the concentration-measuring tank $C_2$ in the above-described test and the silicon concentrations $C_1$ in the respective phosphoric acid solutions at the time of their feeding into the reaction tank 1 are in a proportional relation.

From the relationship and relation confirmed as described above, it has been found that the below-described formulas (A-1) and (A-2) can be established among the silicon concentration $C_1$ of a phosphoric acid solution at the time of its feeding to the reaction tank 1, the silicon concentration $C_2$ of the corresponding solution in the concentration-measuring tank 7 upon elapsed time of a predetermined constant time after the addition of hydrofluoric acid into the reaction tank 1, and the electric conductivity G of the corresponding solution in the concentration-measuring tank 7 at that time. In these formulas, a, b and c are constants derived from experiment data. From these two formulas, the formula (B) can also be derived. This formula (B) means that the silicon concentration $C_1$ of a phosphoric acid solution at the time of its feeding to the reaction tank 1 can be determined by measuring the electric conductivity G of the corresponding solution in the concentration-measuring tank 7.

$$\begin{cases} C_1 = f(C_2) = aC_2 & \text{(A-1)} \\ C_2 = f(G) = bG + c & \text{(A-2)} \end{cases}$$

$$C_1 = f(G) = abG + ac \quad \text{(B)}$$

From the diagram shown in FIG. 3, the constants a, b and c in the formulas can be determined as a=0.973, b=64.5, and c=−65.9. Introduction of these values into the above-described formula (B) results in $C_1$=f(G)=62.8G−64.1. This formula is practically consistent with $C_1$=62.7G−63.8 which is the linear function formula in the diagram shown in FIG. 2. From this, it is possible to conclude that the silicon concentration of a phosphoric acid solution fed to the reaction tank 1 and the conductivity of the corresponding solution in the concentration-measuring tank 7 are closely correlated with each other. It is also understood that the silicon concentration of a phosphoric acid solution to be fed to the reaction tank 1, in other words, a phosphoric acid solution under use in an etching system can be determined by measuring the electric conductivity of the corresponding solution in the concentration-measuring tank 7.

Example 2

Example 1 is directed to an example of a case that a heating means (for example, a heater) is arranged for the phosphoric acid solution in the reaction tank of the measurement equipment. On the other hand, this example is directed to a case that a heating means is not arranged or a heating means is not used. Using experimental equipment of a similar construction as that shown in FIG. 1, an experiment was conducted under substantially the same conditions and procedure as in Example 1. In this example, the heater 11 as a heating means for the phosphoric acid solution in the reaction tank 1 was not used. At the same time as the temperature of the phosphoric acid solution fed to the reaction tank 1 had dropped to a predetermined temperature to be described subsequently herein, a hydrofluoric acid solution was added and bubbling with nitrogen gas from the inert gas feed line 3 was initiated. The bubbling was stopped five minutes later. By conducting the above-described series of measurements under a room-temperature atmosphere of from 24 to 26° C., the temperature descending rate of the phosphoric acid solution under bubbling was maintained constant. In this example, the volume of each phosphoric acid solution to be fed to the reaction tank 1 was set at 150 mL, and the volume of deionized water to be placed in the concentration-measuring tank 7 was set at 80 mL. The remaining experimental procedure and conditions were set as in Example 1.

Using two standard samples of 85% phosphoric acid solutions, the silicon concentrations of which were known to be 0 ppm and 69 ppm, and changing the temperatures of those phosphoric acid solutions at the time of the addition of hydrofluoric acid, an investigation was conducted under the above-described test conditions to determine whether or not a measurement is feasible at a liquid temperature lower than that employed in Example 1. Described specifically, the measurement of the electric conductivity of each solution in the concentration-measuring tank 7 was conducted by changing the temperature of the corresponding phosphoric acid solution at the time of the addition of hydrofluoric acid to 4 temperatures of 70, 80, 90 and 100° C. The thus-obtained electric conductivities had temperature-compensated values. The results so obtained are shown in Table 3.

TABLE 3

| Si concentration in the phosphoric acid solution [ppm] | Temperature of the phosphoric acid solution at the time of the addition of hydrofluoric acid [° C.] | Electric conductivity of the solution in the concentration-measuring tank [mS/cm] |
| --- | --- | --- |
| 0 | 70 | 0.81 |
|  | 80 | 0.94 |
|  | 90 | 1.09 |
|  | 100 | 1.25 |
| 69 | 70 | 1.55 |
|  | 80 | 2.00 |
|  | 90 | 2.61 |
|  | 100 | 2.99 |

Figure 4:
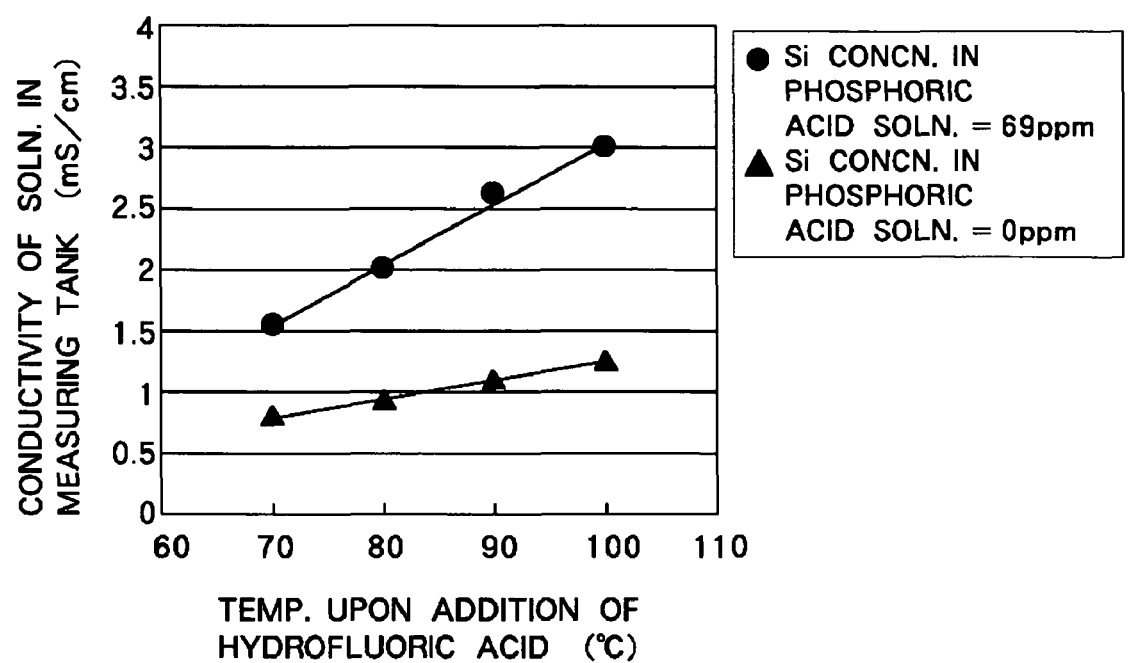
FIG. 4 is a diagrammatic representation of variations in electric conductivity as a result of variations in the silicon concentration in a phosphoric acid solution and also as a result of variations in the temperature of added hydrofluoric acid.

FIG. 4 diagrammatically shows variations in electric conductivity as a result of changes in the temperature, at which hydrofluoric acid was added, at the respective silicon concentrations. From the results, it has been found that, when the temperature at which hydrofluoric acid is added falls within a range of from 70 to 100° C., the electric conductivity varies depending upon a difference in the concentration of silicon in a phosphoric acid solution even when no heating is applied to the phosphoric acid solution under bubbling in the reaction tank. From the above-mentioned finding, it is possible to conclude that under those conditions, silicon tetrafluoride gas was also produced through the reaction between the silicon compound in each phosphoric acid solution and hydrofluoric acid. This means that the concentration of silicon in a phosphoric acid solution can be measured by the measuring method of the present invention without heating the phosphoric acid solution in the reaction tank.

The above-described results indicate that the use of the measuring equipment or method according to the present invention makes it possible to measure, without any pretreatment, the concentration of silicon in a phosphoric acid solution of high temperature and high concentration under recirculation and use during operation of an etching system. Further, the level of silicon concentration in a phosphoric acid solution under recirculation and use in an etching system in operation can be readily determined when the measuring equipment or method according to the present invention is designed such that a portion of the phosphoric acid solution is drawn as a sample, for example, at intervals of from 10 to 20 minutes and is fed to the reaction tank 1 and the conductivity of the solution in the concentration-measuring tank 7 is monitored at predetermined constant intervals. Depending upon the conductivity of a solution which is contained in the concentration-measuring tank 7 and is under monitoring, it is also possible to set the replacement time for a phosphoric acid solution under use or to increase the amount of silicon to be dissolved in a phosphoric acid solution.

As a result, the concentration of silicon in a phosphoric acid solution under use in etching can be controlled to always permit conducting good etching not only when a phosphoric acid of low silicon concentration is used as the phosphoric acid solution but also when a phosphoric acid solution with silicon dissolved therein beforehand is used as the phosphoric acid solution. The measuring equipment and method according to the present invention, therefore, can contribute to the stable and efficient fabrication of high-performance semiconductor substrates.

This application claims the priority of Japanese Patent Application 2005-144075 filed May 17, 2005, which is incorporated herein by reference.

The invention claimed is:

1. Equipment for measuring a silicon concentration in a phosphoric acid solution under use as an etching solution during operation of a semiconductor substrate processing system, said measuring equipment comprising:
    a reaction tank containing phosphoric acid solution comprising silicon compounds that is drawn from the processing system into the reaction tank;
    a concentration-measuring tank containing deionized water, said concentration-measuring tank being separate from the reaction tank; and
    a gas feed line connected between the reaction tank and the concentration-measuring tank,
    wherein the reaction tank comprises:
        a phosphoric acid solution feed line connected between the reaction tank and a phosphoric acid solution recirculation line of the processing system, to feed the phosphoric acid solution comprising silicon compounds that is drawn from the processing system into the reaction tank;
        a hydrofluoric acid feed line connected to the reaction tank, to feed hydrofluoric acid into the reaction tank;
        a means for evaporating, into silicon fluoride gas, silicon fluoride compounds formed by reaction between the phosphoric acid solution and the hydrofluoric acid inside the reaction tank; and
        a means for feeding an inert gas from a lower part of the reaction tank into the phosphoric acid solution in the reaction tank,
    wherein the gas feed line feeds the silicon fluoride gas from the reaction tank into the concentration-measuring tank, and wherein the concentration-measuring tank comprises:
        a deionized water feed line connected to the concentration-measuring tank, to feed the deionized water into the concentration-measuring tank;
        a means for bubbling connected to the gas feed line and arranged inside the concentration-measuring tank, that causes the silicon fluoride gas from the gas feed line to bubble into the deionized water in the concentration-measuring tank, to hydrolyze the silicon fluoride gas in the deionized water; and
        a means for determining a change rate of silicon concentration in the deionized water in the concentration-measuring tank subsequent to said bubbling.

2. The equipment for measuring according to claim 1, wherein said reaction tank further comprises a means for controlling temperature of contents of the reaction tank.

3. The equipment for measuring according to claim 2, wherein the means for controlling temperature controls the temperature at a range of 70 to 180 degrees C.

4. The equipment for measuring according to claim 3, wherein the means for controlling temperature is a heater arranged inside the reaction tank.

5. The equipment for measuring according to claim 1, wherein said means for measuring silicon concentration in the deionized water in the concentration-measuring tank comprises an electric conductivity sensor.

6. The equipment for measuring according to claim 1, wherein the reaction tank further comprises a liquid level sensor arranged inside the reaction tank to enable feeding of a predetermined constant amount of the phosphoric acid solution in the reaction tank.

7. The equipment for measuring according to claim 1, wherein the concentration-measuring tank further comprises a liquid level sensor arranged inside the concentration-measuring tank to enable feeding of a predetermined constant amount of the deionized water in the concentration-measuring tank.

8. The equipment for measuring according to claim 1, wherein the concentration-measuring tank further comprises a liquid-temperature-measuring thermocouple for measuring the temperature of the deionized water in the concentration-measuring tank.

9. Equipment for measuring a silicon concentration in a phosphoric acid solution under use as an etching solution during operation of a semiconductor substrate processing system, said measuring equipment comprising:
    a reaction tank containing phosphoric acid solution comprising silicon compounds that is drawn from the processing system into the reaction tank;
    a concentration-measuring tank containing deionized water, said concentration-measuring tank being separate from the reaction tank; and
    a gas feed line connected between the reaction tank and the concentration-measuring tank,
    wherein the reaction tank comprises:
        a phosphoric acid solution feed line connected between the reaction tank and a phosphoric acid solution recirculation line of the processing system, to feed the phosphoric acid solution comprising silicon compounds that is drawn from the processing system into the reaction tank;
        a liquid level sensor arranged inside the reaction tank to enable feeding of a predetermined constant amount of the phosphoric acid solution in the reaction tank;

a hydrofluoric acid feed line connected to the reaction tank, to feed hydrofluoric acid into the reaction tank;

a means for evaporating, into silicon fluoride gas, silicon fluoride compounds formed by reaction between the phosphoric acid solution and the hydrofluoric acid inside the reaction tank;

a heater for controlling the temperature of contents of the reaction tank at a range of 70 to 180 degrees C.; and a means for feeding an inert gas from a lower part of the reaction tank into the phosphoric acid solution in the reaction tank, wherein the gas feed line feeds the silicon fluoride gas from the reaction tank into the concentration-measuring tank, and wherein the concentration-measuring tank comprises:

a deionized water feed line connected to the concentration-measuring tank, to feed the deionized water into the concentration-measuring tank;

a liquid level sensor arranged inside the concentration-measuring tank to enable feeding of a predetermined constant amount of the deionized water in the concentration-measuring tank;

a liquid-temperature-measuring thermocouple for measuring the temperature of the deionized water in the concentration-measuring tank;

a means for bubbling connected to the gas feed line and arranged inside the concentration-measuring tank, that causes the silicon fluoride gas from the gas feed line to bubble into the deionized water in the concentration-measuring tank, to hydrolyze the silicon fluoride gas in the deionized water; and a means for determining a change rate of silicon concentration in the deionized water in the concentration-measuring tank subsequent to said bubbling, said means for determining a change rate comprising an electric conductivity sensor.

* * * * *